United States Patent [19]

Lam

[11] Patent Number: 4,686,674
[45] Date of Patent: Aug. 11, 1987

[54] MULTIPLEXER WITH INHIBIT FOR ECL GATE ARRAY

[75] Inventor: Nim C. Lam, Sunnyvale, Calif.

[73] Assignee: Fairchild Semiconductor, Cupertino, Calif.

[21] Appl. No.: 807,929

[22] Filed: Dec. 12, 1985

[51] Int. Cl.$^4$ .................. H04J 3/04; H03K 17/76
[52] U.S. Cl. ........................... 370/112; 307/243; 328/104
[58] Field of Search ............... 370/112, 110.1; 307/243; 328/104, 154

[56] References Cited

U.S. PATENT DOCUMENTS

| 4,524,443 | 6/1985 | Crocker et al. | 370/112 |
|---|---|---|---|
| 4,593,390 | 6/1986 | Hildebrand et al. | 370/112 |
| 4,616,358 | 10/1986 | Rehm et al. | 370/112 |

*Primary Examiner*—Douglas W. Olms
*Assistant Examiner*—Curtis Kuntz
*Attorney, Agent, or Firm*—Clifton L. Anderson

[57] ABSTRACT

A multiplexer with inhibit is implemented so that an active inhibit signal effectively sets the select signals to block all but the selected input signal and effectively masks the selected input signal. In the case of the disclosed emitter-coupled logic 4:1 multiplexer, enable signal controlled transistors (Q24 and Q25) are in parallel with transistors (Q14 and Q15) respectively controlled by the select signals (S0 and S1). Activating the enable signal (EN) effectively selects one input (A3) and blocks the others (A0, A1 and A2). A third enable activated transistor (Q35) is in parallel with the transistor (Q13) controlled by the selected input (A3). The activated enable masks the selected signal to complete the inhibit function. Thus, a standard function is implemented with a reduced free-standing and total transistor count.

4 Claims, 2 Drawing Figures

MULTIPLEXER WITH INHIBIT FOR ECL GATE ARRAY

BACKGROUND OF THE INVENTION

The present invention relates to electronic circuits, and, more particularly, to a multiplexer with inhibit adaptable to emitter-coupled logic gate arrays.

Gate arrays are semiconductor devices with standard doping layers and customizable metalization layers. Gate arrays allow a design effort to obtain application specific integrated circuits while avoiding the long lead times involved in designing a circuit from scratch. Since they are neither off-the-shelf items, nor entirely customized, gate arrays are considered semi-custom devices. Gate arrays can be fabricated according to a variety of process technologies, for example, complementary metal-on-oxide (CMOS) and bipolar emitter-coupled logic (ECL).

To facilitate custom design, the gate array is divided into a number of transistor groupings or "cells". A cell library defines logic functions which can be implemented in a predetermined number of cells. The cell size is selected by the producer of the gate array blanks to optimize the customization process. The number of transistors per cell should be large enough to provide useful logic functions, and yet not so large as to limit the flexibility of the ultimate design. However, the cell size is made less significant by providing for half-cell or multiple-cell logic functions.

The cell library is dependent on the process technology, e.g., CMOS or ECL, the cell design, characteristics of the associated computer-aided design (CAD) software, and the intended market. However, one common objective for cell libraries is to maximize the functionality per unit cell. As a first approximation, this means minimizing the transistor count for a given function.

However, the problem is more complex than this, since the interconnections among gate array transistors are subject to constraints. Typically, ECL gate array designs require one or more sets of transistors to share collectors; thus not all transistors are "free-standing". An ECL circuit, even though its transistor count is within that of a cell, can still be excluded from the cell library if the number of free-standing transistors exceeds that available for a cell. Thus, in implementing a function, both the free-standing transistor count and the total transistor count must be considered.

Maximizing functionality is especially important for cells which are likely to be repeated many times within a given gate array design. A multiplexer (MUX) cell, for example, may be implemented hundreds of times within a design intended for complex information routing. A multiplexer is basically a switch the output of which is, or is the inverse of, a selected one of several inputs.

A MUX is characterizable by the number of inputs, e.g. there are 2:1 MUXs, 3:1 MUXs, etc. Typically, a MUX includes an output, the several inputs, and select lines. Some MUXs include a provision for an enable or inhibit signal so that there is an option to select none of the inputs. These are important, for example, in computer buses and information exchange networks to avoid contention for shared communications lines.

The present invention is directed to a multiplexer with an inhibit provision for use in an ECL gate array.

The inhibit function is typically added to the multiplexer either at the inputs or at the output.

In the first approach, the inhibit function is provided by logically combining the inhibit signal with each input. For example, when each input is ORed with an inhibit logic "1", the output is constant no matter which input is selected. In the case of an ECL 4:1 MUX, this approach could be implemented by paralleling each input gate with an inhibit transistor. The disadvantage of this approach is that it requires an additional active transistor for each input line, and can require four additional collector contacts. The additional contacts are not always available in a gate array and, when available, can slow down the MUX.

The inhibit signal can be combined with the output signal by adding another logic level, and therefore an additional delay. The additional delay can be avoided as far as the data timing is concerned, at the expense of additional free-standing transistors. In the case of an ECL 4:1 MUX, this provides no transistor count advantage over the inhibiting-the-inputs approach.

While, in some cases, the cost of the above approaches is small, in many cases, the free-standing or total transistor count can be exceeded by one transistor. The need for this additional transistor count can require an additional cell, greatly diminishing the functional efficiency of an incorporating design. Furthermore, the available designs can add logic delays and otherwise impair the operating speed of the circuit. The challenge addressed by the present invention is implementing the MUX with inhibit function more efficiently.

SUMMARY OF THE INVENTION

In accordance with the present invention, a MUX with inhibit macro logically combines an inhibit signal with each select line and with the input line selected when the inhibit is active. The inhibit can be active low or active high, and can be treated as an active high or low enable. In fact, the inhibit can be active high with respect to some signals and active low with respect to others. As an active low, the inhibit signal can be logically ANDed with the associated signal, and as an active high, the inhibit can be logically ORed.

In the context of ECL gate array cells, the inhibit, or enable, functions can be added in parallel to the select and the input lines. Thus, no additional delays are introduced. The number of transistors added can be one more than the number of select lines. In the case of a 4:1 MUX, the inhibit function costs three additional transistors. These additional transistors need not be free-standing in that they can share a common collector.

This approach requires fewer additional transistors and collector contacts than the inhibiting the inputs approach. Additionally, no additional logic levels or delays are required. Thus speed and functional efficiency advantages are provided over the prior art approaches.

DETAILED DESCRIPTION OF THE PREFERRED EMBODIMENT

Figure 1:
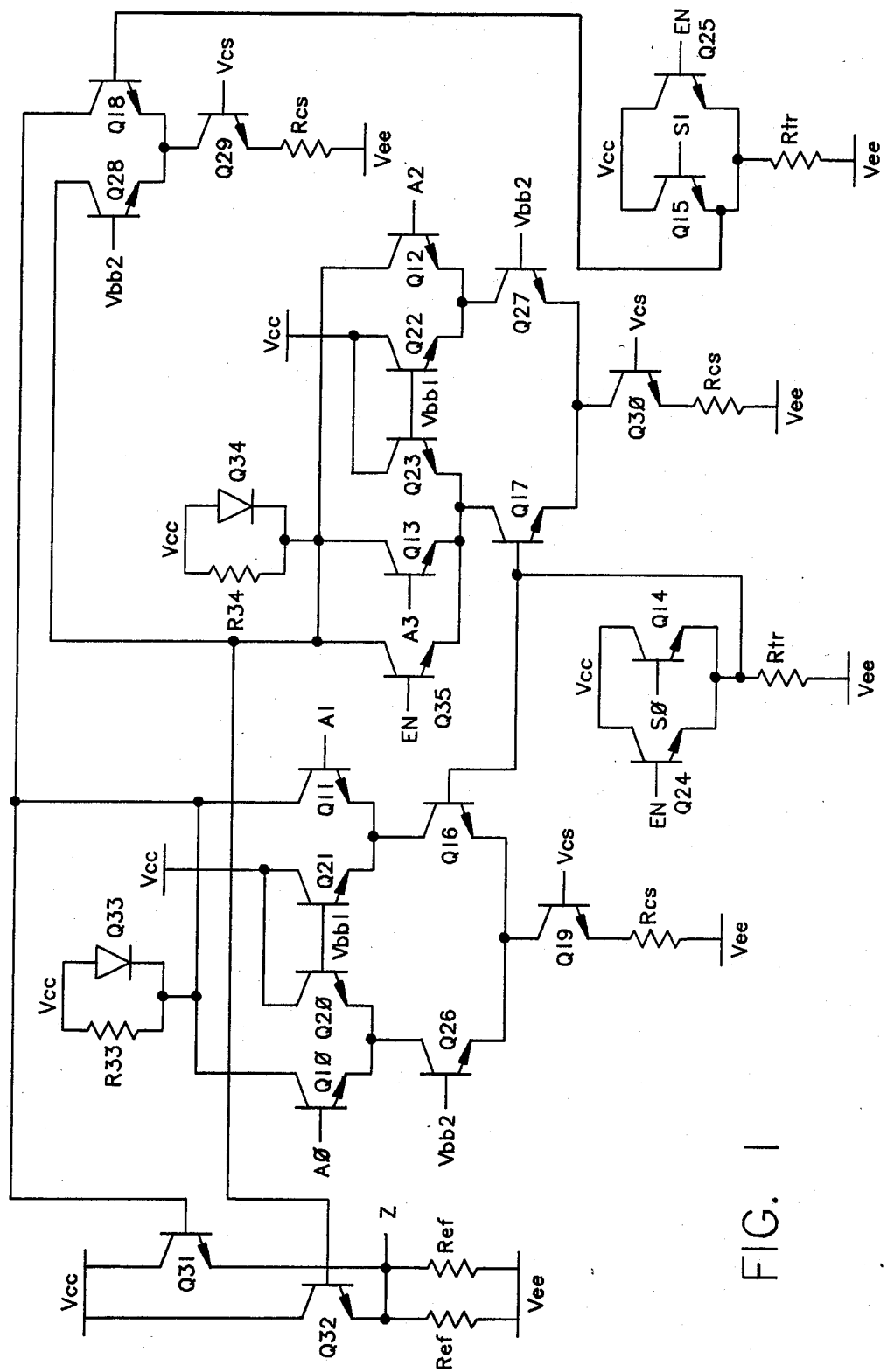
FIG. 1 is a circuit diagram of a multiplexer with inhibit in accordance with the present invention.

A MUX with inhibit is implemented with an inhibit signal EN logically combined with select signals S0 and S1 and with one input A3, as illustrated in FIG. 1. Activating the inhibit signal EN has the same effect as setting S0 and S1 to select input A3. Since A3 is masked, none of the inputs are reflected in the output.

Figure 2:
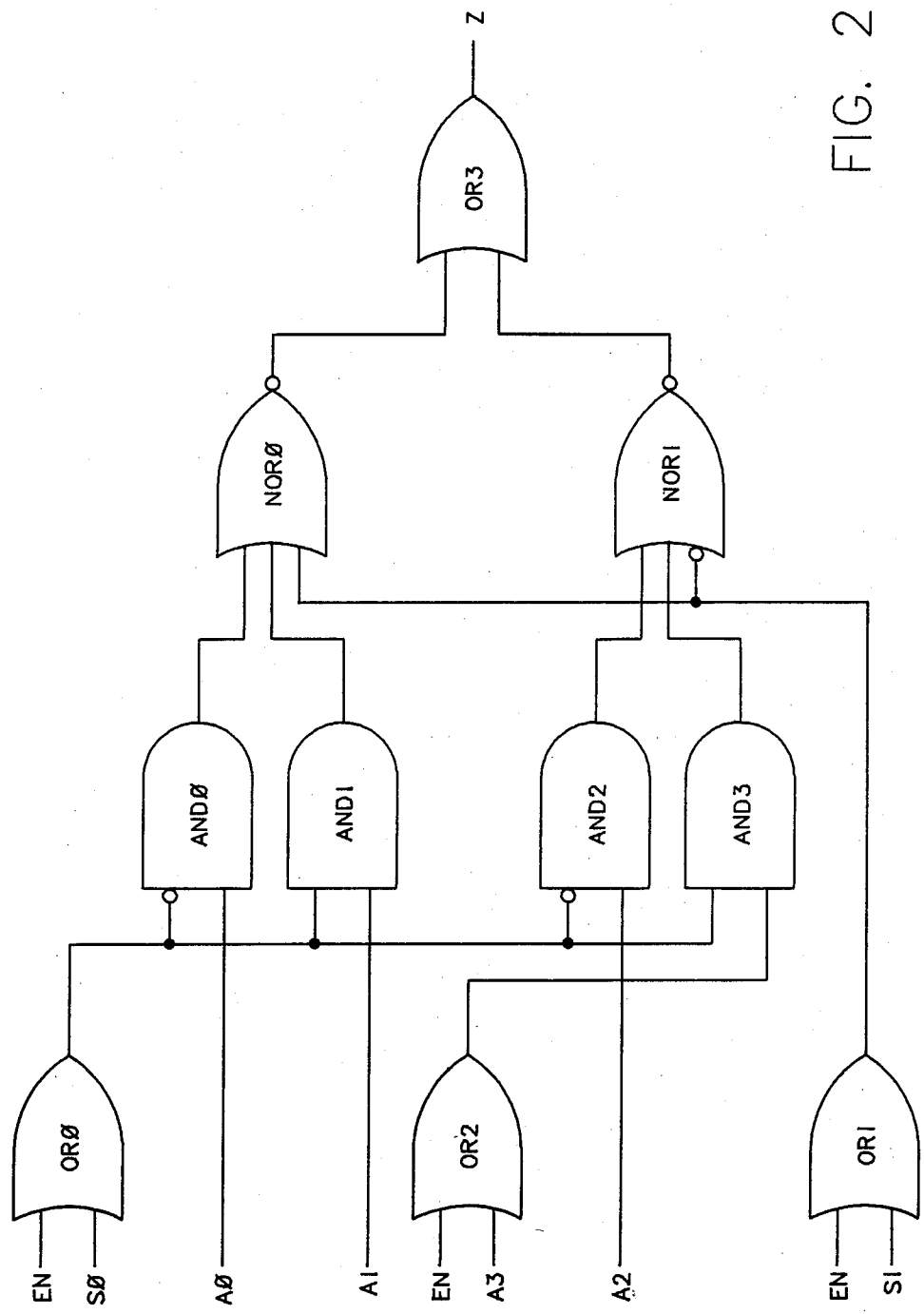
FIG. 2 is a logic diagram for the circuit of FIG. 1.

More specifically, the circuit is a 4:1 MUX with inhibit, a logic diagram for which is illustrated in FIG. 2. Referring to the logic diagram, the inhibit signal EN is ORed with the select signal S0 at OR0, with S1 at OR1, and with one input signal, A3, at OR2.

When EN=0, the circuit operates as a standard 4:1 MUX. S0=0 selects A0 at AND0 and A2 at AND2, and blocks A1 at AND1 and A3 and AND3. Setting S0=1 has the opposite effect. When S1=0 the selected of A0 and A1 is selected at NOR0 and the selected of A2 and A3 is blocked at NOR1. When S=1, the opposite occurs, so that the first-level selection of either A2 or A3 is selected at the second logic level. The final gate ORZ directs the final selected input to the output line Z. The output signal at Z is the inverse of the signal at the selected input.

When the inhibit is active, EN=1, the output is held low, Z=0, as follows. The effect of EN=1 at gate OR0 is to enable AND1 and AND3, and to block A0 and A2 at AND0 and AND2. The effect of the inhibit at OR1 is to block A1 at NOR0. The gate NOR1 is enabled by EN=1, and serves to invert the output of gate OR2, and to direct this inverted output to OR3 and to the output Z. However, with EN=1, A3 is effectively masked, the output of OR2 being constantly high. Gate NOR1 inverts this to a low, at which level Z is held until the inhibit becomes inactive.

Comparing the schematic of FIG. 1 with the logic diagram of FIG. 2, inputs A0, A1, A2, and A3 control transistors Q10, Q11, Q12 and Q13, respectively, relative to reference voltages established at transistors Q20, Q21, Q22 and Q23, respectively. Select signals S0 and S1 control transistors Q14 and Q15 respectively, and the inhibit signal EN controls transistors Q24, Q25 and Q35. The Z output is result of the wired OR of the emitters of transistors Q31 and Q32. Inhibit transistor Q24 is in parallel with select S0 input transistor Q14 so as to implement logic gate OR0. Similarly, inhibit transistor Q25 is in parallel with select S1 input transistor Q15 to implement gate OR1.

Inhibit transistor Q35 is in parallel with the A3 input transistor Q13 and the corresponding reference transistor Q23 to define gate OR2. The output of gate OR0 controls transistors Q16 and Q17 relative to reference level transistors Q26 and Q27 respectively. When S0=0, Q26 is on for A0 to pass, and when S1=1, Q16 is on for A1 to pass; thus gates AND0 and AND1 are implemented. Gates AND2 and AND3 are implemented in a similar manner at transistors Q17 and Q27.

When S1=0, transistor Q18 is off and Q28 is on. The current through Q28 originates at Vcc and passes through load resistor R34. The voltage drop through resistor R34 causes a logic low at the base of transistor Q32. This has the effect of blocking inputs A2 and A3, thus, implementing gate NOR1. In the event that additional current is required according to the settings of transistors Q12, Q13 and Q35, diode Q34, a transistor with the base and collector connected, turns on to prevent the voltage at the base of Q32 from falling below operating range.

Logic gate NOR0 is implemented analogously. S1=1 turns Q18 on, drawing current through load resistor R33, dropping the voltage at Q31 to a logic low. This blocks A0 and A1 from the output. Again, a diode Q33 prevents the voltage at Q31 from dropping below its operating range. The output Z is the wired ORed result of the signals from Q31 and Q32, thus implementing gate OR3.

The inhibit function is effected as follows. EN=1 turns on resistors Q24, and consequently Q16 and Q17, Q25 and consequently Q18, and Q35. Since Q18 is on, Q31 is off, inhibiting A0 and A1. Since Q17 is on, Q27 is off, inhibiting A2. Since Q35 is on, current through resistor R34 maintains Q32 at a logic low. Since Q31 and Q32 are both off, Z is held low until the inhibit is inactivated.

The remainder of the circuit is standard ECL. The inputs and outputs nominally switch between a logical high of −860 mV to a logic low of −1440 mV. Other nominal voltages are: Vee=−4500 mV, Vcc=0 V, Vbb1=−1160 mV and Vbb2=−1920 mV. Current source transistors, Q19, Q29 and Q30, are maintained at a voltage nominally 1320 mV above Vee by resistors Rcs. Resistors Ref and Rtr also perform standard functions.

Many variations and modifications of the illustrated embodiment are within the scope of the present invention. For example, different component arrangements, processing technologies, and multiplexing ratios are provided for. For example, an 8:1 MUX with inhibit could be advantageously implemented with only four transistors required over those used in an 8:1 MUX without inhibit. Different logics are contemplated: the output can be inverted or noninverted, and the inhibit can be active high or active low. Of course, the inhibit can be alternatively treated as an enable. These and other modifications and variations are provided for by the present invention which is limited only by the scope of the following claims.

What is claimed is:

1. A multiplexer comprising:
   means for receiving plural input signals;
   means for receiving a select signal set including at least one select signal;
   means for producing an output signal as a function of one of said input signals, said one of said input signals being selected according to the value of said select signal set;
   means for receiving an inhibit signal;
   means for logically combining said inhibit signal with said select signal set so that a predetermined exactly one of said input signals is selected when said inhibit signal is active; and
   means for logically combining said inhibit signal with said predetermined exactly one of said input signals to yield an intermediate signal with a predetermined value when said inhibit signal is active, said two combining means being coupled with said means for producing an output signal so that said output is forced to a predetermined logic level when said inhibit signal is active.

2. A multiplexer comprising:
   inputs for four data signals, two select signals and an inhibit signal;
   means for providing an output signal as a function of one of said input signals, as selected according to the values of said select signals;
   means for logically combining said inhibit signal with said select signal so that a predetermined exactly one of said input signals is selected when the inhibit signal is active; and
   means for logically combining said inhibit signal with said predetermined exactly one of said input signals to yield an intermediate signal with a predetermined value when said inhibit signal is active, said two combining means being coupled with said means for producing an output signal so that said output is forced to a predetermined logic level when said inhibit signal is active.

3. An emitter-coupled logic 4:1 multiplexer with inhibit comprising:

four input transistors controlled by respective data input signals;

first and second select transistors controlled by respective select signals;

output means, including means for coupling said input and select transistors, for providing an output signal reflecting one of said input signals as selected by the levels of said select signals; and first, second, and third inhibit transistors controlled by a common inhibit signal, said first inhibit transistor being in parallel with said first select transistor, said second inhibit transistor being in parallel with said second select transistor, and said third inhibit transistor being in parallel with the one of said input transistors selected when said first and second select transistors are set to logic high so that when said inhibit signal is active said output is forced to a predetermined logic level, and when said inhibit is inactive, the output is a function of the data signal selected according to the status of said select signals.

4. The multiplexer of claim 1 wherein said means for producing an output signal is coupled to said means for receiving plural input signals and to said means for receiving a select signal set, said means for logically combining said inhibit signal with said select signal set being coupled to said means for receiving said inhibit signal and to said means for receiving a select signal set, said means for logically combining said inhibit signal with said predetermined one of said input signal being coupled to said means for receiving an input signal and said means for receiving plural input signals.

* * * * *